(12) United States Patent
Zhang et al.

(10) Patent No.: US 12,471,455 B2
(45) Date of Patent: Nov. 11, 2025

(54) DISPLAY SUBSTRATE AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Bo Zhang, Beijing (CN); Xiangdan Dong, Beijing (CN); Rong Wang, Beijing (CN)

(73) Assignees: CHENGDU BOE OPTOELECTRONICS TECHNOLOGY CO., LTD., Sichuan (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 469 days.

(21) Appl. No.: 17/433,020

(22) PCT Filed: Mar. 24, 2020

(86) PCT No.: PCT/CN2020/080830
§ 371 (c)(1),
(2) Date: Aug. 23, 2021

(87) PCT Pub. No.: WO2021/189232
PCT Pub. Date: Sep. 30, 2021

(65) Prior Publication Data
US 2022/0344438 A1    Oct. 27, 2022

(51) Int. Cl.
*H10K 59/131* (2023.01)
*H10K 59/121* (2023.01)

(52) U.S. Cl.
CPC ....... *H10K 59/131* (2023.02); *H10K 59/1213* (2023.02); *H10K 59/1216* (2023.02)

(58) Field of Classification Search
CPC ............. H10K 59/131; H10K 59/1213; H10K 59/1216; H01L 23/482
See application file for complete search history.

(56) References Cited

U.S. PATENT DOCUMENTS 5,757,450 A * 5/1998 Fujii ..................... G02F 1/1345
349/151
7,352,426 B2 * 4/2008 Abe .................. G02F 1/136286
349/149

(Continued)

FOREIGN PATENT DOCUMENTS

| CN | 1851924 A | 10/2006 |
| CN | 1922730 A | 2/2007 |

(Continued)

OTHER PUBLICATIONS

Extended European Search report dated Apr. 17, 2023 received in European Patent Application No. EP 20926999.2.

(Continued)

*Primary Examiner* — Bitew A Dinke
(74) *Attorney, Agent, or Firm* — Scully, Scott, Murphy & Presser, P.C.

(57) ABSTRACT

A display substrate and a display device are provided. The display substrate includes: a base substrate, conductive strips and an interlayer insulating layer. The base substrate includes a bonding region; a plurality of conductive strips is in the bonding region on the base substrate, each conductive strip includes a first conductive sub-strip and a second conductive sub-strip which stack, the second conductive sub-strip is at a side of the first conductive sub-strip away from the base substrate; the interlayer insulating layer is between the first conductive sub-strip and the second conductive sub-strip. The interlayer insulating layer includes a stripe-shaped hole extending along an extending direction of the plurality of conductive strips, and the stripe-shaped hole (Continued)

is configured to expose the first conductive sub-strip so that the second conductive sub-strip is electrically connected with the first conductive sub-strip.

14 Claims, 4 Drawing Sheets

(56) References Cited

U.S. PATENT DOCUMENTS

| | | | | |
|---|---|---|---|---|
| 7,394,510 | B2* | 7/2008 | Oh | G02F 1/136213 |
| | | | | 349/110 |
| 11,232,755 | B2* | 1/2022 | Yang | H10K 59/131 |
| 11,515,379 | B2* | 11/2022 | Du | H10K 59/124 |
| 2002/0051110 | A1* | 5/2002 | Kim | H01L 27/1288 |
| | | | | 349/149 |
| 2003/0063229 | A1* | 4/2003 | Takahashi | G02F 1/136286 |
| | | | | 349/43 |
| 2006/0250538 | A1 | 11/2006 | Kim | |
| 2007/0120152 | A1* | 5/2007 | Chang | G02F 1/133345 |
| | | | | 257/270 |
| 2008/0001244 | A1 | 1/2008 | Schwarzbauer | |
| 2008/0137021 | A1* | 6/2008 | Choi | G02F 1/1345 |
| | | | | 349/150 |
| 2009/0296038 | A1* | 12/2009 | Yoon | G02F 1/1339 |
| | | | | 349/149 |
| 2014/0117314 | A1* | 5/2014 | Jeong | C07K 14/245 |
| | | | | 257/40 |
| 2015/0187803 | A1* | 7/2015 | Moh | G02F 1/13458 |
| | | | | 438/23 |
| 2017/0098413 | A1* | 4/2017 | Lee | G09G 3/3233 |
| 2017/0235199 | A1* | 8/2017 | Wang | G02F 1/13306 |
| | | | | 349/149 |
| 2017/0262109 | A1* | 9/2017 | Choi | H10K 59/122 |
| 2017/0277288 | A1* | 9/2017 | Choi | H10K 50/844 |
| 2018/0061855 | A1 | 3/2018 | Min et al. | |
| 2018/0083072 | A1* | 3/2018 | Kwon | H10D 86/60 |
| 2018/0130856 | A1* | 5/2018 | Kim | H10K 59/1315 |
| 2018/0358383 | A1* | 12/2018 | Zhou | H01L 23/49 |
| 2018/0366529 | A1* | 12/2018 | Lee | H10K 59/1213 |
| 2019/0012031 | A1* | 1/2019 | Kim | H10K 59/38 |
| 2019/0041915 | A1* | 2/2019 | Park | H10K 59/1213 |
| 2019/0095007 | A1* | 3/2019 | Jeong | H10K 77/111 |
| 2019/0096975 | A1* | 3/2019 | Park | H10K 59/873 |
| 2019/0115385 | A1* | 4/2019 | Moriwaki | H01L 31/105 |
| 2019/0148653 | A1* | 5/2019 | Chen | H10K 50/8445 |
| | | | | 345/173 |
| 2019/0198819 | A1* | 6/2019 | Shin | H10K 59/38 |
| 2019/0348476 | A1* | 11/2019 | Kato | G09F 9/30 |
| 2020/0064700 | A1* | 2/2020 | Cheng | G02F 1/136204 |
| 2020/0089368 | A1* | 3/2020 | Shim | H10K 71/00 |
| 2020/0103991 | A1* | 4/2020 | Nie | G02F 1/13338 |
| 2020/0142268 | A1* | 5/2020 | Shin | G02F 1/13458 |
| 2020/0218391 | A1* | 7/2020 | Kamiya | G06F 3/042 |
| 2020/0227443 | A1* | 7/2020 | Yamaguchi | H10D 86/423 |
| 2021/0082962 | A1* | 3/2021 | Cui | G02F 1/1345 |
| 2021/0083013 | A1* | 3/2021 | Bang | H10K 59/131 |
| 2021/0118343 | A1* | 4/2021 | Im | G09G 3/3291 |
| 2021/0143225 | A1* | 5/2021 | Park | H10K 50/84 |
| 2021/0183893 | A1* | 6/2021 | Feng | H01L 24/05 |
| 2021/0191557 | A1* | 6/2021 | Jin | G06F 3/0443 |
| 2021/0257577 | A1* | 8/2021 | Bang | H10K 59/40 |
| 2022/0344438 | A1* | 10/2022 | Zhang | H10K 59/1213 |

FOREIGN PATENT DOCUMENTS

| | | |
|---|---|---|
| CN | 107785394 A | 3/2018 |
| CN | 109523912 A | 3/2019 |
| CN | 109860253 A | 6/2019 |
| JP | 2007128688 A | 5/2007 |

OTHER PUBLICATIONS

Notice of First Office Action dated Jun. 26, 2024 received in Chinese Patent Application No. 202080000350.1.

* cited by examiner

DISPLAY SUBSTRATE AND DISPLAY DEVICE

CROSS-REFERENCE TO RELATED APPLICATION

This application is a national phase entry of PCT International Application No. PCT/CN2020/080830, filed on Mar. 24, 2020. The disclosure of PCT International Application No. PCT/CN2020/080830 is incorporated by reference herein.

TECHNICAL FIELD

At least one embodiments of the present disclosure relates to a display substrate and a display device.

BACKGROUND

At present, ultra-thin, ultra-narrow frame and even borderless displays have attracted more and more attention, so many manufacturers are developing towards the production of ultra-narrow frame and even borderless displays. Organic light emitting diode display devices can realize narrow frames by adopting technologies such as Chip On Film (COF) or Chip On Plastic (COP).

SUMMARY

Embodiments of the disclosure provide a display substrate and a display device.

Embodiments of the disclosure provide a display substrate, comprising: a base substrate, comprising a display region and a bonding region on at least one side of the display region; a plurality of sub-pixels in the display region; a plurality of data lines in the display region and connected with the plurality of sub-pixels to provide data signals to the plurality of sub-pixels; a plurality of data leads in the bonding region and electrically connected with the plurality of data lines; at least one group of conductive strips in the bonding region and at a side of the plurality of data leads away from the display region, the at least one group of conductive strips comprising a plurality of conductive strips, at least one of the plurality of conductive strips comprising a first conductive sub-strip and a second conductive sub-strip, and the second conductive sub-strip being at a side of the first conductive sub-strip away from the base substrate; an interlayer insulating layer between the first conductive sub-strip and the second conductive sub-strip; wherein the first conductive sub-strip is electrically connected with one of the plurality of data leads, the interlayer insulating layer comprises a stripe-shaped hole extending along an extending direction of the plurality of conductive strips, and the stripe-shaped hole is configured to expose the first conductive sub-strip, so that the second conductive sub-strip is electrically connected with the first conductive sub-strip.

For example, in an embodiment of the disclosure, an aspect ratio of the strip-shaped hole is not less than 5.

For example, in an embodiment of the disclosure, a width of the strip-shaped hole is in a range from 3 microns to 5 microns.

For example, in an embodiment of the disclosure, a slope angle between an inner surface of the strip-shaped hole and the base substrate ranges from 30 degrees to 40 degrees.

For example, in an embodiment of the disclosure, along an extending direction of at least one of the plurality of conductive strips, a length of the strip-shaped hole is 1-10 microns less than a length of the second conductive sub-strip in the extending direction.

For example, in an embodiment of the disclosure, the strip-shaped hole is a continuous strip-shaped hole extending along the extending direction of the at least one of the plurality of conductive strips.

For example, in an embodiment of the disclosure, the strip-shaped hole comprises a plurality of sub-strip-shaped holes arranged along an extending direction of at least one of the plurality of conductive strips, a gap is provided between two adjacent sub-strip-shaped holes among the plurality of sub-strip-shaped holes, and a length of at least one of the plurality of sub-strip-shaped holes is in a range from 15 microns to 30 microns.

For example, in an embodiment of the disclosure, the plurality of sub-strip-shaped holes are uniformly arranged along the extending direction of the at least one of the plurality of conductive strips.

For example, in an embodiment of the disclosure, the second conductive sub-strip comprises a first conductive layer, a second conductive layer and a third conductive layer which are sequentially stacked.

For example, in an embodiment of the disclosure, a material of the first conductive layer and a material of the third conductive layer comprise titanium, and a material of the second conductive layer comprises aluminum.

For example, in an embodiment of the disclosure, the at least one group of conductive strips comprises two groups of conductive strips, and the two groups of conductive strips are arranged along a direction away from the display region.

For example, in an embodiment of the disclosure, at least one of the plurality of sub-pixels comprises a pixel circuit and a light emitting element, and the pixel circuit is between the base substrate and the light emitting element; the light emitting element comprises a first electrode, a light emitting layer and a second electrode which are sequentially stacked, and the second electrode is at a side of the light emitting layer facing the base substrate; the pixel circuit comprises at least one thin film transistor, the thin film transistor comprises a gate electrode on the base substrate, and a source electrode and a drain electrode at a side of the gate electrode away from the base substrate, and the source electrode or the drain electrode of the thin film transistor is electrically connected with the second electrode; and the gate electrode and the first conductive sub-strip are arranged in a same layer.

For example, in an embodiment of the disclosure, the plurality of data lines extend along a first direction, and the display substrate further comprises: a plurality of gate lines extending along a second direction, the plurality of data lines being at a side of the plurality of gate lines away from the base substrate, and the first direction being intersected with the second direction, wherein the second conductive sub-strip is arranged in a same layer as the plurality of data lines, the source electrode or the drain electrode.

For example, in an embodiment of the disclosure, at least one of the plurality of sub-pixels further comprises a storage capacitor, the storage capacitor comprises two capacitor electrodes, at least one of that plurality of data leads, one of the two capacitor electrodes of the storage capacitor and the gate electrode are arrange in a same layer.

For example, in an embodiment of the disclosure, an extending direction of at least one of the plurality of conductive strips is not parallel to either the first direction or the second direction.

For example, in an embodiment of the disclosure, along the second direction, a maximum width of the first conductive sub-strip is less than a maximum width of the second conductive sub-strip, and a maximum width of the strip-shaped hole in the second direction is less than a maximum width of the first conductive sub-strip.

For example, in an embodiment of the disclosure, the two groups of conductive strips comprise a first conductive strip group and a second conductive strip group, both the first conductive strip group and the second conductive strip group comprise a row of conductive strips arranged along the second direction, and the first conductive strip group is at a side of the second conductive strip group close to the display region.

For example, in an embodiment of the disclosure, the plurality of data leads comprise a plurality of first data leads connected with the first conductive strip group and a plurality of second data leads connected with the second conductive strip group, the plurality of first data leads and the plurality of second data leads are alternately arranged, and each of the plurality of second data leads passes through a gap between adjacent conductive strips in the first conductive strip group.

Embodiments of the disclosure provide a display device comprising a circuit structure and the display substrate according to any one of items as mentioned above, wherein the circuit structure comprises a third conductive sub-strip, and the third conductive sub-strip is electrically connected with the second conductive sub-strip through a conductive adhesive to write a signal to the second conductive sub-strip.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative to the disclosure.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Unless otherwise specified, the technical terms or scientific terms used in the disclosure shall have normal meanings understood by those skilled in the art. The words "first", "second" and the like used in the disclosure do not indicate the sequence, the number or the importance but are only used for distinguishing different components. The word "comprise", "include" or the like only indicates that an element or a component before the word contains elements or components listed after the word and equivalents thereof, not excluding other elements or components.

Figure 1:
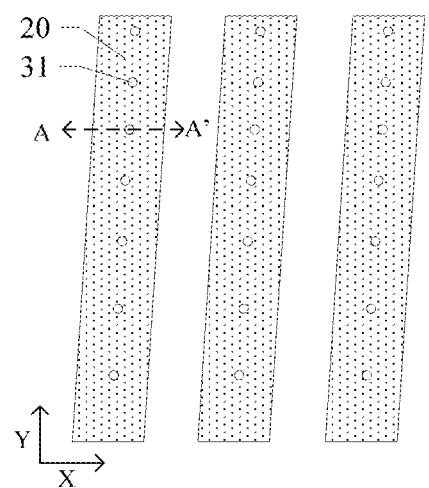
FIG. 1 is a partial planar structural view of a strip-shaped electrode in a bonding region of a display substrate.
Figure 2:
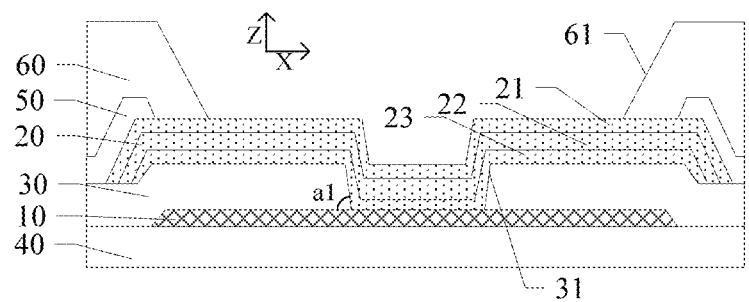
FIG. 2 is a partial cross-sectional structural view taken along line AA' as shown in FIG. 1.

FIG. 1 is a partial planar structural view of a strip-shaped electrode in a bonding region of a display substrate of the present application, and FIG. 2 is a partial cross-sectional structural view taken along line AA' as shown in FIG. 1. As shown in FIG. 1 and FIG. 2, the bonding region (non-display region) of the display substrate includes a plurality of strip-shaped electrodes (contact pads), each strip-shaped electrode includes a first conductive sub-strip 10 and a second conductive sub-strip 20 which are electrically connected, the second conductive sub-strip 20 is located at a side of the first conductive sub-strip 10 away from the base substrate 40, and the extending direction of the first conductive sub-strip 10 is the same as the extending direction of the second conductive sub-strip 20, and an interlayer insulating layer 30 is disposed between the first conductive sub-strip 10 and the second conductive sub-strip 20. A via hole 31 used for exposing the first conductive sub-strip 10 is provided in the interlayer insulating layer 30, so that the second conductive sub-strip 20 located on the interlayer insulating layer 30 (FIG. 2 merely shows the interlayer insulating layer 30 between the first conductive sub-strip 10 and the second conductive sub-strip 20) is electrically connected with the first conductive sub-strip 10 through the via hole 31. A passivation layer 50 and a planarization layer 60 are disposed at a side of the second conductive sub-strip 20 away from the first conductive sub-strip 10, and the strip-shaped electrode is configured to be bonded with an electrode of a circuit structure, such as Chip On Film (COF), etc., through anisotropic conductive adhesive.

For example, as shown in FIG. 2, the second conductive sub-strip 20 includes a first metal layer 21, a second metal layer 22, and a third metal layer 23 which are stacked, the material of the first metal layer 21 and the material of the third metal layer 23 can include titanium, and the material of the second metal layer 22 can include aluminum.

In research, the inventors of the present application have noticed that the size of the via hole 31 in a direction parallel to the base substrate 40 is in the range of 2.1 microns to 2.5 microns, which is relatively small. Thus, in the process of forming the via hole 31 by using techniques such as etching, exposure, etc., the inner surface of the via hole 31 is formed as a slope, and the included angle a1 (as shown in FIG. 2) between the inner surface and the base substrate 40 is greater than 50 degrees, that is, the slope angle a1 of the slope formed by the inner surface of the via hole 31 is greater than 50 degrees, for example, 70 degrees to 80 degrees. Under a certain stress, because the slope of the small-sized via hole 31 has a large slope angle, that is, the slope is steep, it easily causes the second conductive sub-strip 20 deposited in the via hole 31 to break at the edge of the via hole 31. For example, the first metal layer 21 farthest from the base substrate 40 in the second conductive sub-strip 20 is easily broken at the edge of the via hole 31, resulting in that the second metal layer 22 is exposed, for example, the metal aluminum layer is exposed.

In the manufacturing process of the display substrate shown in FIGS. 1-2, after patterning the planarization layer 60 to form an opening 61 which exposes the second conductive sub-strip 20, an anode film layer of the organic light emitting element is formed at a side of the planarization layer 60 away from the base substrate 40, and the anode film layer is formed in both the display region and the non-display region. In the process of etching the anode film layer in the non-display region by a wet etching technique to form an anode pattern in the display region, the acidic etching solution used for etching the anode film layer may be recycled, and there exist a large number of silver ions in the acidic etching solution. After the first metal layer 21 in the second conductive sub-strip 20 breaks at the edge of the via hole 31 to expose the second metal layer 22, the aluminum in the second metal layer 22 will undergo a displacement reaction with the silver ions in the acidic etching solution, and silver will be precipitated. In the subsequent cleaning process, the precipitated silver will flow irregularly, resulting in the formation of silver particles on the display substrate. The silver particles may cause short circuit between two adjacent strip-shaped electrodes, which affects normal lighting of a panel including the above display substrate, causes Mura phenomenon, and reduces the yield of products.

The embodiments of the present disclosure provide a display substrate and a display device. The display substrate includes a base substrate, and a plurality of sub-pixels, a plurality of data lines, a plurality of data leads, at least one group of conductive strips and an interlayer insulating layer which are located on the base substrate. The base substrate includes a display region and a bonding region located on at least one side of the display region; the plurality of sub-pixels are located in the display region; the plurality of data lines are located in the display region and connected with the plurality of sub-pixels to provide data signals to the plurality of sub-pixels; the plurality of data leads are located in the bonding region and electrically connected with the plurality of data lines; the at least one group of conductive strips are located in the bonding region and at a side of the plurality of data leads away from the display region, the at least one group of conductive strips includes a plurality of conductive strips, at least one of the plurality of conductive strips includes a first conductive sub-strip and a second conductive sub-strip, and the second conductive sub-strip is located at a side of the first conductive sub-strip away from the base substrate; and the interlayer insulating layer is located between the first conductive sub-strip and the second conductive sub-strip. The first conductive sub-strip is electrically connected with one of the plurality of data leads; the interlayer insulating layer includes a strip-shaped hole extending along the extending direction of the plurality of conductive strips, and the strip-shaped hole is configured to expose the first conductive sub-strip, so that the second conductive sub-strip is electrically connected with the first conductive sub-strip. The embodiments of the present disclosure, by arranging a strip-shaped hole which exposes the first conductive sub-strip in the interlayer insulating layer, can not only ensure a relatively large contact area between the first conductive sub-strip and the second conductive sub-strip, but also reduce the probability of fracture of the second conductive sub-strip at the edge of the strip-shaped hole, thereby improving the yield of the display substrate.

Hereinafter, the display substrate and the display device provided by the embodiments of the present disclosure will be described with reference to the accompanying drawings.

Figure 3:
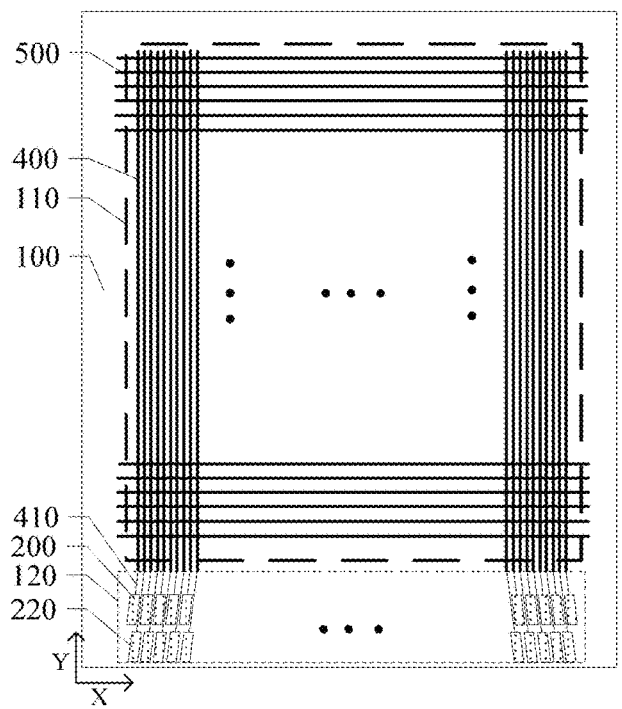
FIG. 3 is a planar structural view of a display substrate provided by an embodiment of the present disclosure.
Figure 4:
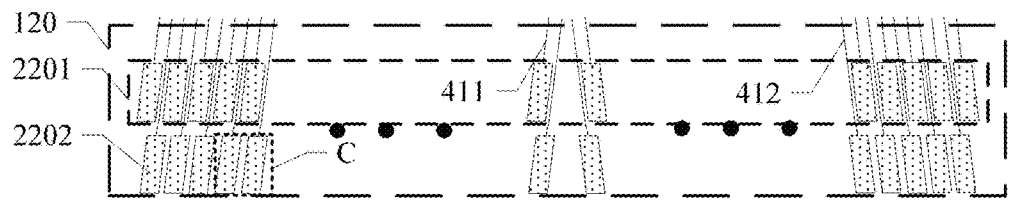
FIG. 4 is a partial enlarged view of a bonding region in the display substrate shown in FIG. 3.
Figure 5:
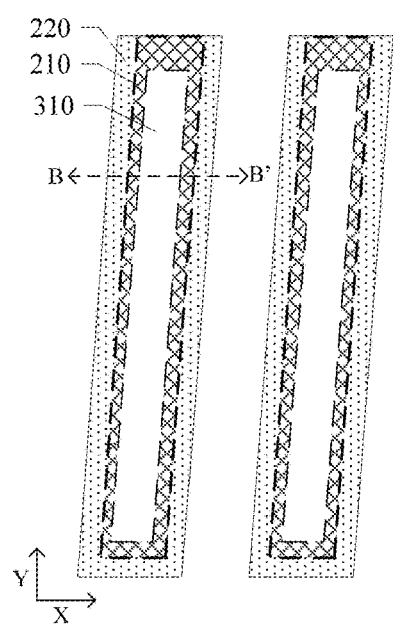
FIG. 5 is an enlarged view of part C shown in FIG. 4 in an example.
Figure 6:
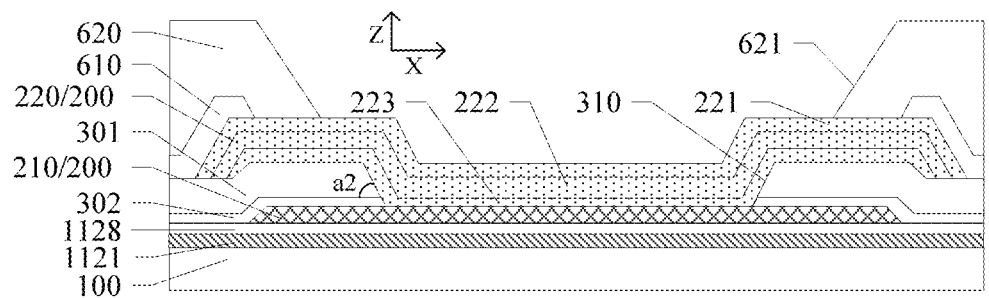
FIG. 6 is a partial cross-sectional structural view taken along line BB' as shown in FIG. 5.

FIG. 3 is a planar structural view of a display substrate provided by an embodiment of the present disclosure, FIG. 4 is a partial enlarged view of a bonding region in the display substrate shown in FIG. 3, FIG. 5 is an enlarged view of part C shown in FIG. 4 in an example, and FIG. 6 is a partial cross-sectional structural view taken along line BB' as shown in FIG. 5. As shown in FIGS. 3-6, the display substrate provided by the embodiment of the present disclosure includes a base substrate 100 and a plurality of conductive strips 200 on the base substrate 100, each conductive strip 200 includes a first conductive sub-strip 210 and a second conductive sub-strip 220 which are stacked, the second conductive sub-strip 220 is located at a side of the first conductive sub-strip 210 away from the base substrate 100, the first conductive sub-strip 210 and the second conductive sub-strip 220 have the same extending direction, and an interlayer insulating layer 301 is disposed between the first conductive sub-strip 210 and the second conductive sub-strip 220. The base substrate 100 includes a display region 110 and a peripheral region located at the periphery of the display region 110, and the peripheral region includes a bonding region 120 for bonding the display substrate with a circuit structure, such as Chip On Film (COF), etc. The conductive strip 200 including the first conductive sub-strip 210 and the second conductive sub-strip 220 is located in the bonding region 120, and the orthographic projection of the second conductive sub-strip 220 on the base substrate 100 is overlapped with the orthographic projection of the first conductive sub-strip 210 on the base substrate 100. As shown in FIGS. 3-6, the interlayer insulating layer 301 includes a strip-shaped hole 310 extending along the extending direction of the conductive strip 200, and the strip-shaped hole 310 is configured to expose the first conductive sub-strip 210, so that the second conductive sub-strip 220 is electrically connected with the first conductive sub-strip 210. The embodiments of the present disclosure, by arranging a strip-shaped hole which exposes the first conductive sub-strip in the interlayer insulating layer, can not only ensure a relatively large contact area between the first conductive sub-strip and the second conductive sub-strip, but also reduce the probability of fracture of the second conductive sub-strip at the edge of the strip-shaped hole, thereby improving the yield of the display substrate.

The planar shape of the conductive strip parallel to the base substrate is a strip shape, and the extending direction of the conductive strip is the extending direction of the long side in the planar shape. The planar shape of the strip-shaped hole parallel to the base substrate is a strip shape, and the length and width of the strip-shaped hole described later refer to the length and width of the planar shape parallel to the base substrate.

A plurality of strip-shaped holes are arranged in the interlayer insulating layer, the plurality of strip-shaped holes are in one-to-one correspondence with the plurality of conductive strips, and each strip-shaped hole is configured to expose the first conductive sub-strip in each conductive strip.

For example, the material of the interlayer insulating layer 301 can include an insulating material, such as silicon oxide or silicon nitride, etc.

For example, as shown in FIG. 3, a data line 400 extending along a first direction (Y direction) and a gate line 500 extending along a second direction (X direction) are provided in the display region 110, the data line 400 is located at a side of the gate line 500 away from the base substrate 100, and the interlayer insulating layer 301 can be disposed between the data line 400 and the gate line 500.

For example, the first direction is intersected with the second direction; and for example, the first direction is perpendicular to the second direction. In the embodiments of the present disclosure, the first direction and the second direction can be interchanged.

For example, as shown in FIGS. 3-6, the extending direction of the conductive strip 200 is not parallel to either the first direction or the second direction. For example, the extending direction of the conductive strip 200 can have an included angle of 8-10 degrees with the first direction. For example, one end of the conductive strip 200 close to the display region 110 is closer to the center line of the display substrate extending in the first direction than one end of the conductive strip 200 away from the display region, thus facilitating connection with the data line. For example, the conductive strips 200 located on both sides of the center line of the display substrate extending in the first direction can be symmetrically distributed with respect to the center line.

For example, the bonding region 120 is located at a side of the display region 110, and is used for electrically connecting an external circuit with the display substrate via a bonding process. For example, the external circuit can include a flexible printed circuit board mounted with a chip (e.g., Chip On Film, COF for short), and the flexible printed circuit board is provided with a control chip or a driving chip, etc. The bonding region can also be used for direct electrical connection with the chip.

For example, the conductive strip 200 located in the bonding region 120 can be a contact pad directly bonded with the driving chip, the base substrate 100 can be a flexible substrate, and by folding the flexible substrate at the bonding region 120 to the back of the flexible substrate away from the data line 400, a narrow frame can be realized. For example, the conductive strip 200 located in the bonding region 120 can also be a contact pad for bonding with Chip On Film.

For example, the data lines 400 can be connected with the plurality of conductive strips 200 in one-to-one correspondence through the plurality of data leads 410 located in the bonding region 120, so that the data lines 400 can be electrically connected with a circuit structure, such as a driving chip or a flexible printed circuit board.

For example, as shown in FIGS. 3-4, the plurality of conductive strips 200 include a first conductive strip group 2201 and a second conductive strip group 2202, both the first conductive strip group 2201 and the second conductive strip group 2202 include a row of conductive strips 200 arranged along the second direction, and the first conductive strip group 2201 is located at a side of the second conductive strip group 2202 close to the display region 110. The embodiment of the present disclosure takes that the conductive strips are arranged in two rows along the second direction as an example, but is not limited to this case, and the conductive strips may also be arranged in one or more rows. That is, the conductive strips can be arranged in one or a plurality of conductive strip groups.

For example, in order to reduce the size of the bonding region along the Y direction, one row of conductive strips, i.e., one conductive strip group, may be provided.

For example, as shown in FIGS. 3-4, the plurality of data leads 410 include a plurality of first data leads 411 connected with the first conductive strip group 2201 and a plurality of second data leads 412 connected with the second conductive strip group 2202, and the plurality of first data leads 411 and the plurality of second data leads 412 are alternately arranged along the second direction. That is, the first data leads 411 can be connected with odd-numbered data lines 400, and the second data leads 412 can be connected with even-numbered data lines 400. The embodiment of the present disclosure is not limited to this case, and the first data leads can be connected with even-numbered data lines, and the second data leads can be connected with odd-numbered data lines.

For example, as shown in FIGS. 3-4, a gap is provided between two adjacent conductive strips 200 in each conductive strip group, and each second data lead 412 passes through the gap between adjacent conductive strips 200 in the first conductive strip group 2201 to be connected with the data line 400. In the embodiment of the present disclosure, two conductive strip groups are arranged, and each second data lead passes through the gap between adjacent conductive strips in the first conductive strip group to be connected with the data line, so that the distance between two adjacent data leads can be reduced, and a fan-shaped wiring region can be avoided to the best, so as to realize a narrow frame design.

For example, a third data lead (not shown in the figure) can also be provided at a side of the first conductive strip group facing the second conductive strip group, and the third data lead extends from a side of the conductive strips in the first conductive strip group away from the display region to pass through the gap between two adjacent conductive strips in the second conductive strip group. That is, along the second direction, the third data lead and the second data lead are alternately arranged to ensure that the data leads between the first conductive strip group and the second conductive strip group are uniformly arranged. The third data lead is only connected with the conductive strip in the first conductive strip group.

For example, in the case where an active semiconductor layer is arranged at a side of the first conductive sub-strip away from the base substrate, an antistatic portion can be provided at a side of each conductive strip away from the display region, the antistatic portion includes a part of the first conductive sub-strip away from the display region and the active semiconductor layer, and this part is connected with the active semiconductor layer to increase resistance and play an antistatic role.

For example, as shown in FIGS. 3-6, the second conductive sub-strip 220 is in a same layer as the data line 400; and for example, the second conductive sub-strip 220 and the data line 400 can be arranged in the same layer and made of the same material. The "same layer" described here and below refers to the relationship between multiple film layers formed by the same material after a same step (e.g., one patterning process). The "same layer" here does not always mean that the thicknesses of the multiple film layers are the same or the heights of the multiple film layers in a cross-sectional view are the same.

For example, the first conductive sub-strip 210 and the gate line 500 can be in a same layer and made of the same material.

For example, at least a part of the first data lead 411 can be arranged in a same layer as the first conductive sub-strip 210 of the conductive strip 200 in the first conductive strip group 2201, and at least a part of the second data lead 412 can be arranged in a same layer as the first conductive sub-strip 210 of the conductive strip 200 in the second conductive strip group 2202. That is, each conductive strip 200 can be connected with a data lead 410 through the first conductive sub-strip 210, so as to be connected with a corresponding data line 400, and therefore, the circuit structure can provide a data signal for the data line.

For example, as shown in FIGS. 3-6, a passivation layer 610 and a planarization layer 620 are disposed at a side of the second conductive sub-strip 220 away from the base substrate 100. An opening 621 which exposes the second conductive sub-strip 220 is provided in the passivation layer 610 and the planarization layer 620, and an electrode strip in the circuit structure, such as Chip On Film (COF), etc., is bonded to the second conductive sub-strip 220 through the opening 621.

For example, the passivation layer 610 and the planarization layer 620 cover the peripheral edges of the second conductive sub-strip 220 to prevent the peripheral edges of the second conductive sub-strip 220 from being damaged in the subsequent process of manufacturing the display substrate.

For example, as shown in FIGS. 5-6, along the second direction, the size of the first conductive sub-strip 210 is less than the size of the second conductive sub-strip 220, that is, along the second direction, the width of the first conductive sub-strip 210 is less than the width of the second conductive sub-strip 220. Along the second direction, the second conductive sub-strip 220 covers the edges of the first conductive sub-strip 210, so that the overlapping area between a union of the passivation layer 610 and the planarization layer 630 at the edge of the second conductive sub-strip 220 and the first conductive sub-strip 210 is reduced, thereby preventing the thickness of the display substrate from being affected due to a large thickness of the film layers covered by the passivation layer 610 and the planarization layer 620 at the edge of the second conductive sub-strip 220.

Figure 7:
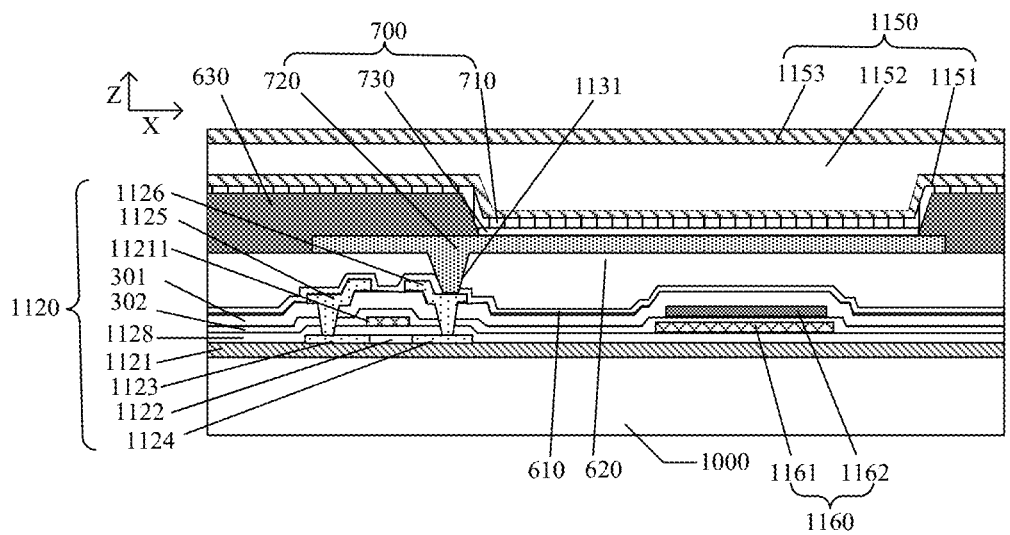
FIG. 7 is a partial cross-sectional structural view of a display region in the display substrate shown in FIG. 3.

For example, FIG. 7 is a partial cross-sectional structural view of a display region in the display substrate shown in FIG. 3. As shown in FIG. 7, the display substrate further includes a light emitting element 700 and a pixel circuit 1120 for driving the light emitting element 700, which are located in the display region 110 of the base substrate 100. For example, the pixel circuit is located between the light emitting element and the base substrate. For example, the pixel circuit can include a thin film transistor, a storage capacitor, etc., and can be implemented in various types, such as 2T1C type (i.e., including two thin film transistors and one storage capacitor), and can further include, on the basis of 2T1C type, more transistors and/or capacitors to have functions of compensation, reset, light emitting control, detection, etc. The embodiment of the present disclosure does not limit the pixel circuit. For example, in some embodiments, the thin film transistor directly electrically connected with the light emitting element can be a driving transistor, or a light emitting control transistor, etc.

For example, as shown in FIGS. 6-7, the display substrate further includes a buffer layer 1121 on the base substrate 100, and the pixel circuit 1120 includes an active layer 1122 on the buffer layer 1121, a first gate insulating layer 1128 on a side of the active layer 1122 away from the base substrate 100 and a gate electrode 11211 on the first gate insulating layer 1128; the gate electrode 11211 is a gate electrode of the thin film transistor directly connected with the light emitting element (e.g., the driving transistor or the light emitting control transistor), and the gate electrode and the first conductive sub-stripe 210 are disposed in a same layer. Therefore, the gate electrode 11211 and the first conductive sub-strip 210 can be formed in a same manufacturing process, for example, formed by using a same material layer through a patterning process.

For example, as shown in FIGS. 6-7, the pixel circuit further includes a second gate insulating layer 302 on the side of the gate electrode 11211 away from the base substrate 100, an interlayer insulating layer 301 on the second gate insulating layer 302, and a source electrode 1125 and a drain electrode 1126 on the interlayer insulating layer 301. The buffer layer 1121 in the display region 110 and the buffer layer 1121 in the bonding region 120 can be of an integrated structure, or can be film layers which are located in the same layer and separated from each other. The first gate insulating layer 1128 in the display region 110 and the first gate insulating layer 1128 in the bonding region 120 can be of an integrated structure, or can be film layers which are located in the same layer and separated from each other; the second gate insulating layer 302 in the display region 110 and the second gate insulating layer 302 in the bonding region 120 can be of an integrated structure, or can be film layers which are located in the same layer and separated from each other; the interlayer insulating layer 301 in the display region 110 and the interlayer insulating layer 301 in the bonding region 120 can be of an integrated structure, or can be film layers which are located in the same layer and separated from each other. As a transition layer, the buffer layer 1121 can not only prevent detrimental substances in the base substrate from intruding into the interior of the display substrate, but also increase the adhesion of the film layer in the display substrate to the base substrate.

For example, the buffer layer 1121 can include an insulating material, such as silicon oxide, silicon nitride, silicon oxynitride, etc. The interlayer insulating layer 301, the second gate insulating layer 302 and the first gate insulating layer 1128 can include insulating materials, such as silicon oxide, silicon nitride, silicon oxynitride, etc. Materials of the interlayer insulating layer 301, the second gate insulating layer 302 and the first gate insulating layer 1128 can be the same or different.

For example, in some examples of the above embodiments of the present disclosure, as shown in FIG. 7, the active layer 1122 can include a source region 1123 and a drain region 1124, and include a channel region located between the source region 1123 and the drain region 1124. The interlayer insulating layer 301, the second gate insulating layer 302, and the first gate insulating layer 1128 have via holes to expose the source region 1123 and the drain region 1124. The source electrode 1125 and the drain electrode 1126 are respectively electrically connected with the source region 1123 and the drain region 1124 through via holes. The drain electrode 1126 and the source electrode 1125 are the first electrode and the second electrode of the thin film transistor directly electrically connected with the light emitting element 700, and for example, the drain electrode of the thin film transistor is electrically connected with the light emitting element 700. Parts of the drain electrode 1126 and the source electrode 1125 which are located on a side of the interlayer insulating layer 301 away from the base substrate 100 are arranged in a same layer as the second conductive sub-strip 220.

Thin film transistors in the embodiments of the present disclosure can include oxide semiconductor thin film transistors, amorphous silicon thin film transistors, or polysilicon thin film transistors, etc. The source electrode and the drain electrode of the thin film transistor can be symmetrical in structure, so the source electrode and the drain electrode can be indistinguishable in physical structure. In the embodiments of the present disclosure, the source electrode and the drain electrode of all or part of the thin film transistors can be interchanged according to actual needs.

For example, as shown in FIG. 7, the gate electrode 11211 is overlapped with the channel region between the source region 1123 and the drain region 1124 in the active layer 1122 in the direction perpendicular to the base substrate 100. The planarization layer 620 and the passivation layer 610 are located above the source electrode 1125 and the drain electrode 1126, and are used to planarize the surface of the pixel circuit at the side away from the base substrate. A via hole 1131 is formed in the planarization layer 620 and the passivation layer 610 to expose the source electrode 1125 or the drain electrode 1126 (the case as shown in the figure). The passivation layer can protect the source electrode and the drain electrode of the pixel circuit from water vapor corrosion.

For example, the material of the active layer 1122 can include poly-silicon or oxide semiconductor (e.g., indium gallium zinc oxide). The material of the gate electrode 11211 can include a metal material or an alloy material, such as a metal single layer or a multi-layer structure formed by molybdenum, aluminum and titanium, etc. For example, the multi-layer structure can be a multi-layer metal laminated layer (e.g., three-layer metal laminated layer formed of titanium, aluminum and titanium (Ti/Al/Ti)). The material of the source electrode 1125 and the material of the drain electrode 1126 can include a metal material or an alloy material, such as a metal single layer or a multi-layer structure formed by molybdenum, aluminum and titanium, etc. The embodiment of the present disclosure does not specifically limit the material of each functional layer. FIG. 7 illustratively shows that the active layer 1122 is located at a side of the gate electrode 11211 facing the base substrate, which it is not limited to this case. And the active layer can also be located at a side of the gate electrode away from the base substrate.

For example, the material of the passivation layer 610 can include an organic insulating material or an inorganic insulating material, such as a silicon nitride material, which has high dielectric constant and good hydrophobic function, and can well protect the pixel circuit from water vapor corrosion.

For example, as shown in FIGS. 6-7, the light emitting element 700 is formed on the planarization layer 620, that is, the light emitting element 700 is disposed at a side of the planarization layer 620 away from the base substrate 100. The light emitting element 700 includes a first electrode 710, a light emitting layer 730 and a second electrode 720, which are sequentially stacked. The second electrode 720 is located at a side of the light emitting layer 730 facing the base substrate 100 and is configured to be connected with a thin film transistor. The display substrate further includes a pixel defining layer 630, an opening of the pixel defining layer 630 exposes a part of the second electrode 720; in the case where the light emitting layer 730 is formed in the opening of the pixel defining layer 630, the light emitting layer 730 is in contact with the second electrode 720, so that this part can drive the light emitting layer 730 to emit light, so as to form an effective light emitting region.

In addition, the display substrate further includes a storage capacitor 1160, and the storage capacitor 1160 can include a first capacitor electrode 1161 and a second capacitor electrode 1162. The first capacitor electrode 1161 is disposed between the first gate insulating layer 1128 and the second gate insulating layer 302, and the second capacitor electrode 1162 is disposed between the second gate insulating layer 302 and the interlayer insulating layer 301. The first capacitor electrode 1161 and the second capacitor electrode 1162 are stacked and at least partially overlapped in the direction perpendicular to the base substrate 100. The first capacitor electrode 1161 and the second capacitor electrode 1162 form a storage capacitor with the second gate insulating layer 302 as a dielectric material. The first storage capacitor electrode 1161 is disposed in the same layer as the gate electrode 11211 in the pixel circuit 1120 and the first conductive sub-strip 210 in the bonding region 120. For example, the first storage capacitor electrode 1161 is disposed in the same layer as the gate electrode 11211 in the pixel circuit 1120 and at least one of the plurality of data leads. The embodiment of the present disclosure is not limited to this case, and for example, the first capacitor electrode and the second capacitor electrode of the storage capacitor can also be located in other layers, so as to obtain sub-pixels with different structures. For example, the first capacitor electrode of the storage capacitor can still be disposed in the same layer as the gate electrode, while the second capacitor electrode of the storage capacitor can be disposed in the same layer as the source electrode and the drain electrode of the thin film transistor, so that the first capacitor electrode and the second capacitor electrode form the storage capacitor with the laminated structure of the second gate insulating layer and the interlayer insulating layer as a dielectric material.

For example, as shown in FIG. 7, the display substrate can further include an encapsulation layer 1150 disposed on the light emitting element 700. The encapsulation layer 1150 seals the light emitting element 700, so that deterioration of the light emitting element 700 caused by moisture and/or oxygen included in the environment can be reduced or prevented. The encapsulation layer 1150 can be a single layer structure or a composite layer structure, and the composite layer structure includes a laminated structure of inorganic layers and organic layers. For example, the encapsulation layer 1150 can include a first inorganic encapsulation layer 1151, an organic encapsulation layer 1152 and a second inorganic encapsulation layer 1153, which are sequentially arranged. The encapsulation layer 1150 can extend to the bonding region, and in the above example, the encapsulation layer does not cover the conductive strip.

For example, the material of the encapsulation layer can include an insulating material, such as silicon nitride, silicon oxide, silicon oxynitride, polymer resin, etc. The inorganic material, such as silicon nitride, silicon oxide, silicon oxynitride, etc., has high compactness and can prevent the invasion of water and oxygen; the material of the organic encapsulation layer can be a polymer material containing desiccant or a polymer material capable of blocking water vapor, such as polymer resin, etc., so as to planarize the surface of the display substrate and relieve the stress of the first inorganic packaging layer and the second inorganic packaging layer, and the material of the organic encapsulation layer can further include a water-absorbing material, such as desiccant, etc., to absorb water, oxygen and other substances invading inside.

For example, as shown in FIGS. 6-7, the film layer, in which the second electrode 720 is located, is located at a side of the second conductive sub-strip 220 away from the base substrate 100. That is, the second electrode 720 is located at a side of the planarization layer 620 away from the second conductive sub-strip 220.

For example, as shown in FIGS. 6-7, a film layer for forming the second electrode 720 of the light emitting element 700 can be deposited on the side of the planarization layer 620 away from the base substrate 100. Because the opening 621 of the planarization layer 620 exposes the second conductive sub-strip 220, the film layer for forming the second electrode includes parts deposited in the display region and the non-display region, and the part located in the non-display region includes a part located on the second conductive sub-strip 220. In the process of etching the film layer for forming the second electrode by a wet etching technique to form the anode pattern in the display region, the acidic etching solution used for etching the film layer for forming the second electrode may be recycled, and there exist a large number of silver ions in the acidic etching solution.

For example, as shown in FIGS. 3-6, the second conductive sub-strip 220 includes three conductive layers which are stacked, and the material of the second conductive layer 222 among the three conductive layers includes aluminum. For example, the materials of the first conductive layer 221 and the third conductive layer 223 among the three conductive layers include titanium. The laminated structure and materials of each layer of the second conductive sub-strip 220 in the embodiment of the present disclosure can be the same as the laminated structure and materials of each layer of the second conductive sub-strip 20 in the display substrate shown in FIGS. 1-2.

For example, as shown in FIGS. 3-6, the aspect ratio of the strip-shaped hole 310 is not less than 5. For example, the width of the strip-shaped hole 310 is in the range of 3-5 microns. The "aspect ratio" of the strip-shaped holes 310 can refer to the ratio of the length of the strip-shaped hole 310 along the extending direction of the conductive strip 200 to the width of the strip-shaped hole 310 along the arrangement direction of the conductive strips 200 (e.g., the second direction). The embodiment of the present disclosure takes the extending direction of the conductive strip as the extending direction of the long sides of the strip-shaped hole and the conductive strip, and takes the second direction as the extending direction of the short sides of the strip-shaped hole and the conductive strip, so the size of the strip-shaped hole in the second direction can also be referred to as the width of the strip-shaped hole in the second direction, and the size of the conductive strip in the second direction can also be referred to as the width of the conductive strip in the second direction.

Compared with the via hole 31 having a relatively small size in the interlayer insulating layer 30 between two conductive strips in the display substrate shown in FIG. 2, in the embodiment of the present disclosure, the via hole in the interlayer insulating layer 301 between the first conductive sub-strip and the second conductive sub-strip is set as a strip-shaped hole 310, the aspect ratio of the strip-shaped hole 310 is not less than 5, and the width of the strip-shaped hole 310 is in the range of 3-5 microns. Therefore, while increasing the contact area between the first conductive sub-strip 210 and the second conductive sub-strip 220 to reduce the resistance of the conductive strip, the probability of the first conductive layer 221 breaking at the edge of the strip-shaped hole 310 can also be reduced, so as to avoid the influence on the yield of the display substrate by preventing the second conductive layer 222 from displacing silver ions in the subsequent acidic etching solution.

For example, as shown in FIGS. 3-6, along the extending direction of the second conductive sub-strip 220, the length of the strip-shaped hole 310 is 1-10 microns less than the length of the second conductive sub-strip 220. For example, the length of the second conductive sub-strip 220 can be 145 microns, and the length of the strip-shaped hole 310 can be 135 microns. For example, the length of the second conductive sub-strip 220 can be 650 microns, and the length of the strip-shaped hole 310 can be 640 microns. For example, along the extending direction of the second conductive sub-strip 210, the length of the strip-shaped hole 310 is 4-6 microns less than the length of the second conductive sub-strip 220.

The size of the via hole 31 in the planarization layer 30 shown in FIGS. 1-2 is relatively small, which may cause the second conductive sub-strip 20 formed in the via hole 31 to be unable to effectively contact with the subsequent circuit structure; as a result, the contact area between the second conductive sub-strip 20 and the circuit structure is small, the contact resistance is large, and the connectivity is poor. In the embodiment of the present disclosure, the size of the strip-shaped hole 310 is large, and the second conductive sub-strip 220 located in the strip-shaped hole 310 can achieve a better electrical connection effect with the subsequent circuit structure through anisotropic conductive adhesive. In addition, compared with the via hole 31 shown in FIG. 2, more anisotropic conductive adhesive can be accommodated in the strip-shaped hole 310 in the embodiment of the present disclosure, which increases the contact area between the anisotropic conductive adhesive and the second conductive sub-strip, thus increasing the bonding strength between the anisotropic conductive adhesive and the second conductive sub-strip, and further, ensuring the quality of the display substrate.

For example, as shown in FIGS. 3-6, the included angle a2 (shown in FIG. 6) between the inner surface of the strip-shaped hole 310 and the base substrate 100 ranges from 30 degrees to 40 degrees. For example, in the process of forming the strip-shaped hole 310 by using techniques such as etching, exposure, etc., the inner surface of the strip-shaped hole 310 is formed as a slope, and the slope angle a2 of the slope ranges from 30 degrees to 40 degrees. For example, the cross section of the strip-shaped hole 310 cut by a surface perpendicular to the base substrate includes a bevel side, and the included angle a2 between the bevel side and the base substrate ranges from 30 degrees to 40 degrees. The inner surface of the strip-shaped hole 310 can be a planar surface or a curved surface; in the case where the inner surface of the strip-shaped hole is a planar surface, the bevel side is a straight side; in the case where the inner surface of the strip-shaped hole is a curved surface, the bevel side is a curved side, and in this case, taking that the slope of the connecting line between the midpoint at half the height of the strip-shaped hole and the intersection of the curved side of the strip-shaped hole and the first conductive sub-strip is the slope of the bevel side of the strip-shaped hole as an example, the angle between the connecting line and the base substrate is the inclination angle a2 of the inner surface. Compared with the case in which the included angle between the inner surface of the via hole 31 in the interlayer insulating layer 30 and the base substrate 40 ranges from 70 degrees to 80 degrees as shown in FIG. 2, in the embodiment of the present disclosure, the length and width of the strip-shaped hole 310 are designed to be relatively large, which can make the included angle between the inner surface of the strip-shaped hole 310 and the base substrate 100 smaller, that is, the inclined angle of the inner surface of the strip-shaped hole 310 becomes smaller, and the slope formed by the inner surface of the strip-shaped hole 310 becomes gentle, which can prevent the second conductive sub-strip 220 subsequently formed in the strip-shaped hole 310 from breaking at the edge of the strip-shaped hole 310, and improve the yield of the display substrate.

For example, as shown in FIGS. 3-6, the strip-shaped hole 310 is a continuous strip-shaped hole extending along the extending direction of the first conductive sub-strip 210. That is, each first conductive sub-strip 210 corresponds to a continuous strip-shaped hole 310 and the first conductive sub-strip 210 is electrically connected with a second conductive sub-strip 220 through the continuous strip-shaped hole 310.

For example, as shown in FIGS. 3-6, the orthographic projection of the strip-shaped hole 310 on the base substrate 100 is located within the orthographic projection of the first conductive sub-strip 210 on the base substrate 100. For example, the orthographic projection of the strip-shaped hole 310 on the base substrate 100 is located in the middle of the orthographic projection of the second conductive sub-strip 220 on the base substrate 100, so that the second conductive sub-strip 220 in the strip-shaped hole 310 and the first conductive sub-strip 210 can have a good electrical connection relationship.

Figure 8:
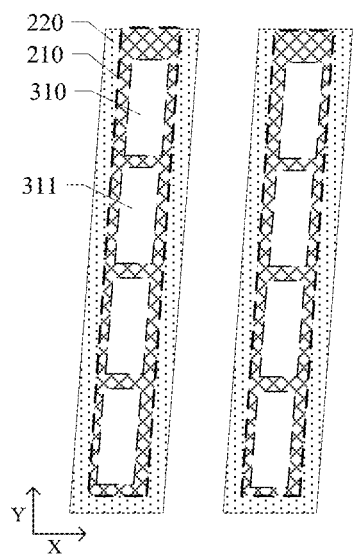
FIG. 8 is an enlarged view of part C shown in FIG. 4 in another example.

FIG. 8 is an enlarged view of part C shown in FIG. 3 in another example. The example shown in FIG. 8 is different from the example shown in FIG. 5 in that the strip-shaped hole 310 shown in FIG. 8 includes a plurality of sub-strip-shaped holes 311 arranged along the extending direction of the first conductive sub-strip 210, a gap is provided between adjacent sub-strip-shaped holes 311, and the length of at least one sub-strip-shaped hole 311 is in the range of 15-30 microns. Compared with the case where a plurality of small-sized via holes are provided in the planarization layer of the display substrate shown in FIG. 2, in the embodiment of the present disclosure, the plurality of sub-strip-shaped holes provided in the planarization layer can not only increase the contact area between the first conductive sub-strip and the second conductive sub-strip to reduce the resistance of the conductive strip, but also reduce the probability that the first conductive layer of the second conductive sub-strip breaks at the edge of the sub-strip-shaped hole, and prevent the second conductive layer from displacing silver ions in the subsequent acidic etching solution.

For example, the included angle between the inner surface of the sub-strip-shaped hole 311 and the base substrate 100 ranges from 30 degrees to 40 degrees, that is, the inclination angle of the inner surface of the sub-strip-shaped hole 311 ranges from 30 degrees to 40 degrees. The embodiment of the present disclosure, by setting the length of the sub-strip-shaped hole in the range of 15-30 microns, can reduce the included angle between the inner surface of the sub-strip-shaped hole and the base substrate; that is, the inclination angle of the inner surface of the sub-strip-shaped hole can be reduced, which can prevent the second conductive sub-strip subsequently formed in the sub-strip-shaped hole from breaking at the edge of the sub-strip-shaped hole, and improve the yield of the display substrate.

In the embodiment of the present disclosure, the size of the sub-strip-shaped hole is large, and the second conductive sub-strip located in the sub-strip-shaped hole can achieve a better electrical connection effect with the circuit structure through anisotropic conductive adhesive. In addition, in the embodiment of the present disclosure, more anisotropic conductive adhesive can be accommodated in each sub-strip-shaped hole, which increases the contact area between the anisotropic conductive adhesive and the second conductive sub-strip, thus increasing the bonding strength between the anisotropic conductive adhesive and the second conductive sub-strip, and further, ensuring the quality of the display substrate.

For example, as shown in FIG. 8, the plurality of sub-strip-shaped holes 311 are uniformly arranged along the extending direction of the first conductive sub-strip 210, so that the uniformity of the electrical connection between the electrode strip of the circuit structure and the second conductive sub-strip can be ensured.

Figure 9:
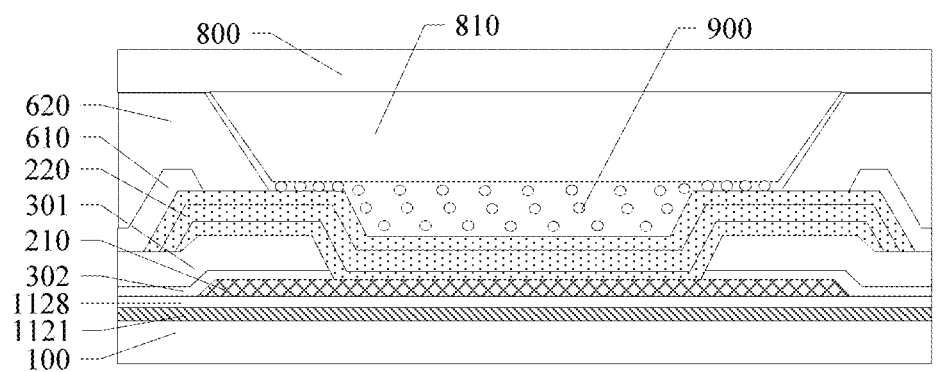
FIG. 9 is a partial cross-sectional structural view of a display device provided by an embodiment of the present disclosure.

Another embodiment of the present disclosure provides a display device, which can include the display substrate provided by any one of the above embodiments. FIG. 9 is a partial cross-sectional structural view of a display device provided by an embodiment of the present disclosure. As shown in FIG. 9, the display device includes the display substrate and a circuit structure 800, the circuit structure 800 includes a third conductive sub-strip 810, the third conductive sub-strip 810 is electrically connected with the second conductive sub-strip 220 through a conductive adhesive 900 to write a signal to the second conductive sub-strip 220.

For example, as shown in FIG. 9, the circuit structure 800 includes a plurality of third conductive sub-strips 810, and the plurality of third conductive sub-strips 810 are connected with the plurality of second conductive sub-strips 220 in one-to-one correspondence. FIG. 9 only illustratively shows the electrical connection between one third conductive sub-strip 810 and one second conductive sub-strip 220.

For example, as shown in FIG. 9, the third conductive sub-strip 810 of the circuit structure 800 extends into the opening defined by the planarization layer 620, so as to realize the electrical connection with the second conductive sub-strip 220 through the anisotropic conductive adhesive 900.

For example, the circuit structure 800 can include a flexible printed circuit board. For example, the flexible printed circuit board can be bonded to the bonding region of the display substrate, and the control chip can be mounted on the flexible printed circuit board, thereby being electrically connected with the display region. For example, the circuit structure can include Chip On Film.

For example, the display device can adopt COP (Chip On Plastic) technology, the circuit structure 800 can include a control chip, the control chip can be directly bonded to the bonding region, thereby being electrically connected with the display region. For example, the base substrate can be a flexible substrate, and by folding the flexible substrate at the bonding region to the side of the flexible substrate away from the data line, that is, folding the flexible substrate to the back, the occupation of "chin" space by the display device can be minimized, thereby realizing a narrow frame.

For example, the control chip can be a central processing unit, a digital signal processor, a System-on-a-Chip (SoC), etc. For example, the control chip can further include a memory, a power module, etc., and realize the functions of power supply and signal input and output through additionally arranged wires and signal lines. For example, the control chip can further include hardware circuits and computer executable codes, etc. The hardware circuits can include conventional Very Large Scale Integration (VLSI) circuits or gate arrays, and existing semiconductor elements, such as logic chips and transistors, or other discrete elements; the hardware circuits can also include field programmable gate arrays, programmable array logic, programmable logic devices, etc.

For example, the display device provided by at least one embodiment of the present disclosure can be any product or component with display function, such as a mobile phone, a tablet computer, a television, a display, a notebook computer, a digital photo frame, a navigator, etc.

The following statements should be noted:

(1) The accompanying drawings related to the embodiment(s) of the present disclosure involve only the structure (s) in connection with the embodiment(s) of the present disclosure, and other structure(s) can be referred to common design(s).

(2) In case of no conflict, features in one embodiment or in different embodiments of the present disclosure can be combined.

The foregoing is merely exemplary embodiments of the invention, but is not used to limit the protection scope of the invention. The protection scope of the invention shall be defined by the attached claims.

What is claimed is:

1. A display substrate, comprising:
a base substrate, comprising a display region and a bonding region on at least one side of the display region;
a plurality of sub-pixels in the display region;
a plurality of data lines in the display region and connected with the plurality of sub-pixels to provide data signals to the plurality of sub-pixels;
a plurality of data leads in the bonding region and electrically connected with the plurality of data lines;
at least one group of conductive strips in the bonding region and at a side of the plurality of data leads away from the display region, the at least one group of conductive strips comprising a plurality of conductive strips, at least one of the plurality of conductive strips comprising a first conductive sub-strip and a second conductive sub-strip, and the second conductive sub-strip being at a side of the first conductive sub-strip away from the base substrate; and
an interlayer insulating layer between the first conductive sub-strip and the second conductive sub-strip;
wherein the first conductive sub-strip is electrically connected with one of the plurality of data leads, and
wherein the interlayer insulating layer comprises a strip-shaped hole extending along an extending direction of the plurality of conductive strips, and the strip-shaped hole is configured to expose the first conductive sub-strip, so that the second conductive sub-strip is electrically connected with the first conductive sub-strip,
wherein a width of the strip-shaped hole is in a range from 3 microns to 5 microns, a ratio of a length of the strip-shaped hole along the extending direction of the plurality of conductive strips to the width of the strip-shaped hole is not less than 5, and
wherein a slope angle between an inner surface of the strip-shaped hole and the base substrate ranges from 30 degrees to 40 degrees,
wherein a part of the second conductive sub-strip located in the strip-shaped hole forms a recessed portion, and the second conductive sub-strip is configured to be bonded with an electrode of a circuit structure through anisotropic conductive adhesive at least arranged in the recessed portion,
wherein the second conductive sub-strip comprises a first conductive layer, a second conductive layer and a third conductive layer which are sequentially stacked, and
wherein a material of the first conductive layer and a material of the third conductive layer comprise titanium, and a material of the second conductive layer comprises aluminum.

2. The display substrate according to claim 1,
wherein, along an extending direction of at least one of the plurality of conductive strips, a length of the strip-shaped hole is 1-10 microns less than a length of the second conductive sub-strip in the extending direction.

3. The display substrate according to claim 2,
wherein the strip-shaped hole is a continuous strip-shaped hole extending along the extending direction of the at least one of the plurality of conductive strips.

4. The display substrate according to claim 1,
wherein a section of the strip-shaped hole corresponding to a same second conductive sub-strip comprises a plurality of sub-strip-shaped holes arranged along an extending direction of at least one of the plurality of conductive strips, a gap is provided between two adjacent sub-strip-shaped holes among the plurality of sub-strip-shaped holes, and a length of at least one of the plurality of sub-strip-shaped holes is in a range from 15 microns to 30 microns.

5. The display substrate according to claim 4,
wherein the plurality of sub-strip-shaped holes are uniformly arranged along the extending direction of the at least one of the plurality of conductive strips.

6. The display substrate according to claim 1,
wherein the at least one group of conductive strips comprises two groups of conductive strips, and the two groups of conductive strips are arranged along a direction away from the display region.

7. The display substrate according to claim 6,
wherein at least one of the plurality of sub-pixels comprises a pixel circuit and a light emitting element, and the pixel circuit is between the base substrate and the light emitting element,
wherein the light emitting element comprises a first electrode, a light emitting layer and a second electrode which are sequentially stacked, and the second electrode is at a side of the light emitting layer facing the base substrate, and
wherein the pixel circuit comprises at least one thin film transistor, the thin film transistor comprises a gate electrode on the base substrate, and a source electrode and a drain electrode at a side of the gate electrode away from the base substrate, and the source electrode or the drain electrode of the thin film transistor is electrically connected with the second electrode.

8. The display substrate according to claim 7,
wherein the plurality of data lines extend along a first direction, and the display substrate further comprises:
a plurality of gate lines extending along a second direction, the plurality of data lines being at a side of the plurality of gate lines away from the base substrate, and the first direction being intersected with the second direction.

9. The display substrate according to claim 8,
wherein at least one of the plurality of sub-pixels further comprises a storage capacitor, the storage capacitor comprises two capacitor electrodes.

10. The display substrate according to claim 8,
wherein an extending direction of at least one of the plurality of conductive strips is not parallel to either the first direction or the second direction.

11. The display substrate according to claim 8,
wherein, along the second direction, a maximum width of the first conductive sub-strip is less than a maximum width of the second conductive sub-strip, and a maximum width of the strip-shaped hole in the second direction is less than a maximum width of the first conductive sub-strip.

12. The display substrate according to claim 6,
wherein the two groups of conductive strips comprise a first conductive strip group and a second conductive strip group, both the first conductive strip group and the second conductive strip group comprise a row of conductive strips arranged along the second direction, and the first conductive strip group is at a side of the second conductive strip group close to the display region.

13. The display substrate according to claim 12, wherein the plurality of data leads comprise a plurality of first data leads connected with the first conductive strip group and a plurality of second data leads connected with the second conductive strip group, the plurality of first data leads and the plurality of second data leads are alternately arranged, and each of the plurality of second data leads passes through a gap between adjacent conductive strips in the first conductive strip group.

14. A display device, comprising a circuit structure and the display substrate according to claim 1, wherein the circuit structure comprises a third conductive sub-strip, and the third conductive sub-strip is electrically connected with the second conductive sub-strip through a conductive adhesive to write a signal to the second conductive sub-strip.

\* \* \* \* \*